(12) United States Patent
Tsai et al.

(10) Patent No.: US 10,602,640 B1
(45) Date of Patent: Mar. 24, 2020

(54) MEMORY COOLERS

(71) Applicant: HEWLETT PACKARD ENTERPRISE DEVELOPMENT LP, Houston, TX (US)

(72) Inventors: Pinche Tsai, Houston, TX (US); Minh Nguyen, Houston, TX (US); David A. Selvidge, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/190,596

(22) Filed: Nov. 14, 2018

(51) Int. Cl.
*H05K 7/20* (2006.01)
*G06F 1/20* (2006.01)

(52) U.S. Cl.
CPC .......... *H05K 7/20254* (2013.01); *G06F 1/20* (2013.01); *G06F 2200/201* (2013.01)

(58) Field of Classification Search
None
See application file for complete search history.

(56) References Cited

U.S. PATENT DOCUMENTS

| | | | | |
|---|---|---|---|---|
| 6,349,035 | B1* | 2/2002 | Koenen | H01L 23/4093 257/727 |
| 7,342,797 | B2* | 3/2008 | Kamath | G06F 1/184 257/E23.102 |
| 7,933,125 | B2* | 4/2011 | Wei | G06F 1/20 165/185 |
| 7,965,508 | B2* | 6/2011 | Yamamoto | H01L 23/473 174/15.1 |
| 8,004,841 | B2 | 8/2011 | Cipolla et al. | |
| 8,570,744 | B2* | 10/2013 | Rau | G06F 1/20 361/679.52 |
| 8,659,897 | B2 | 2/2014 | Meijer et al. | |
| 9,245,820 | B2 | 1/2016 | Goldrian et al. | |

(Continued)

FOREIGN PATENT DOCUMENTS

TW M296591 Y 8/2006

OTHER PUBLICATIONS

David Watts, "ThinkSystem SD650 Direct Water Cooled Server," Sep. 11, 2018, pp. 1-39 (online), Lenovo, Retrieved from the Internet on Oct. 15, 2018 at URL: <lenovopress.com/lp0636-thinksystem-sd650-direct-water-cooled-server>.

(Continued)

*Primary Examiner* — Courtney L Smith
(74) *Attorney, Agent, or Firm* — Tong, Rea, Bentley & Kim, LLC

(57) ABSTRACT

In example implementations, a memory cooler is provided. The memory cooler includes a body. The body includes two pieces that are moveable relative to one another. Each piece of the body includes an inlet manifold, an outlet manifold, and a plurality of cold plates extending between the inlet manifold and the outlet manifold. The inlet manifold is to receive liquid coolant from a liquid coolant supply line. The outlet manifold is to return the liquid coolant to the liquid coolant supply line. The liquid coolant flows from the inlet manifold to the outlet manifold through interior channels of the cold plates. The plurality of cold plates of a first piece of the body are interleaved with the plurality of cold plates of a second piece of the body such that slots to receive memory modules are defined between adjacent pairs of cold plates.

19 Claims, 7 Drawing Sheets

(56) References Cited

U.S. PATENT DOCUMENTS

| | | | |
|---|---|---|---|
| 2002/0114140 A1* | 8/2002 | Bash | H05K 7/20636 |
| | | | 361/719 |
| 2008/0084668 A1* | 4/2008 | Campbell | H01L 23/473 |
| | | | 361/702 |
| 2011/0209855 A1 | 9/2011 | Peterson et al. | |
| 2012/0020004 A1* | 1/2012 | Rau | G06F 1/20 |
| | | | 361/679.31 |
| 2018/0084672 A1* | 3/2018 | Berk | G06F 1/20 |

OTHER PUBLICATIONS

Titan Technology Limited, "Memory Heatsink Ram Cooler (silver)," 2018, pp. 1-5 (online), Retrieved from the Internet on Oct. 8, 2018 at URL: <titan-cd.com/en/product/Memory-Heatsink-RAM-Cooler-Silver/TTC-MHR04.html>.

* cited by examiner

MEMORY COOLERS

BACKGROUND

Computer hardware can be used to perform various processes and functions, execute various applications, and the like. The computer hardware may have a processor and a memory. The processor may access instructions stored in the memory for applications such as word processing, video games, and the like.

DETAILED DESCRIPTION

Examples described herein provide a memory cooler to efficiently cool memory of a computing device. As discussed above, computer hardware can be used to execute applications or perform various different processes. Processing demands for computer hardware continue to increase. As processing demands increase, the amount of power and heat generated by certain components within the computer hardware can also increase.

When memory devices overheat, the memory devices can fail. Some methods may try to cool the memory devices using a fan or by using heat sink fins to try to dissipate the heat away from the memory devices. However, these methods may not be able to sufficiently cool the memory devices.

The present disclosure provides a memory cooler. The memory cooler may have a body that is comprised of two separate cold plates that are stacked and coupled together via a spring. The walls of the cold plates may enclose a memory device and associated securing mechanisms. The cold plates may have an interior volume or channels that allow a cooling fluid to flow through the cold plates.

When the spring loaded clamping memory manifold is engaged, the cold plates of the two pieces of the body may contact the memory device. The cooling fluid that flows through the cold plates may efficiently cool the memory device during operation.

When the memory cooler is disengaged, the cold plates may be separated into a service position. In the service position, the securing mechanisms may be disengaged to replace, add, or fix the memory devices. Thus, the memory cooler provides an efficient cooling mechanism for memory devices, while also providing easy access to the memory devices.

Figure 1:
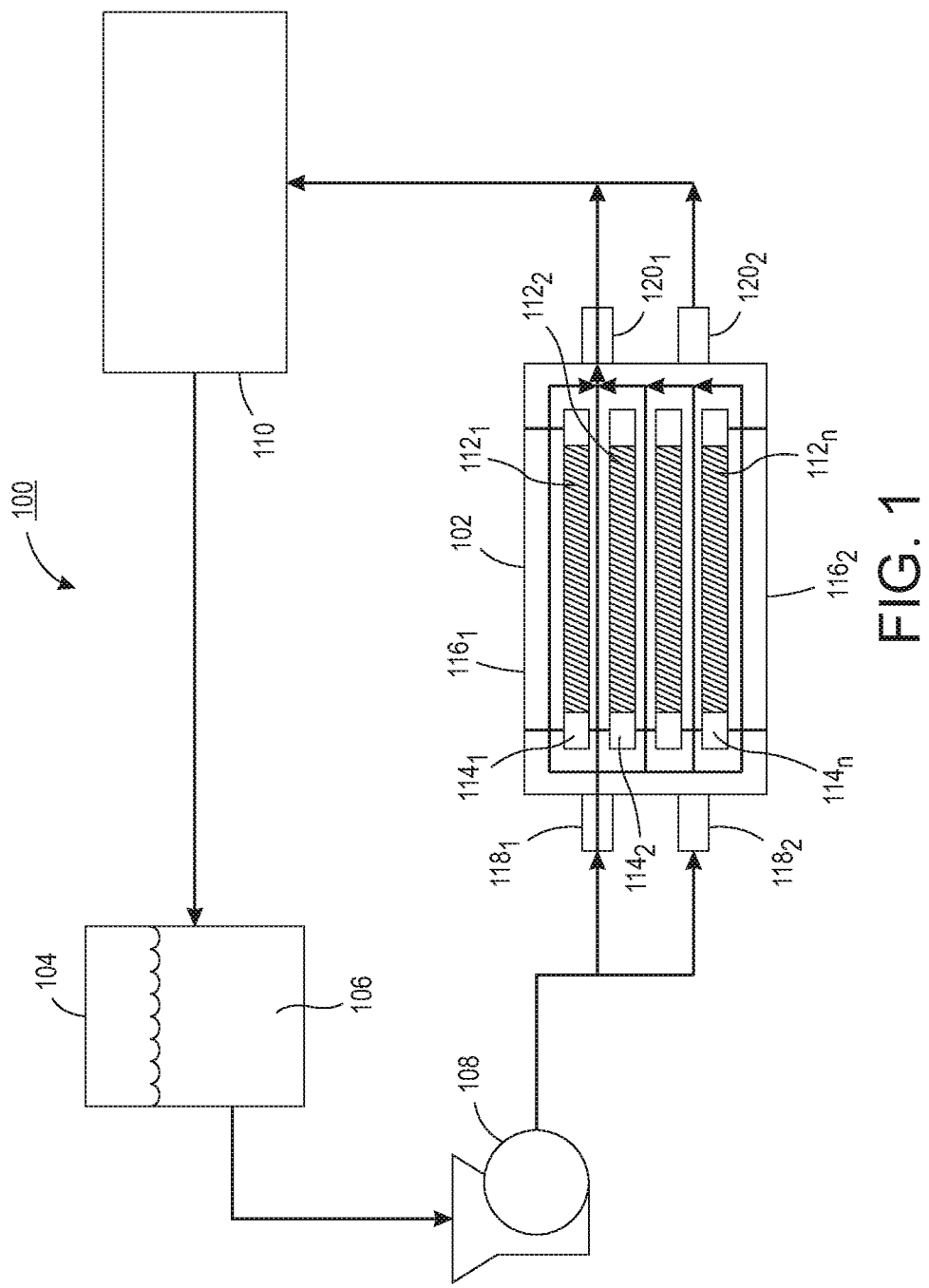
FIG. 1 is a block diagram of an example memory cooling system of the present disclosure.

FIG. 1 illustrates an example memory cooling system 100 of the present disclosure. In one example, the memory cooling system 100 may include a memory cooler 102, a reservoir 104 with cooling liquid 106, a pump 108, and a heat exchanger 110. In one example, the cooling liquid 106 may be fed through the memory cooler 102 to cool memory modules or memory devices $112_1$-$112_n$ (hereinafter also referred to individually as a memory module 112 or collectively as memory modules 112).

In one example, the cooling liquid 106 may be any type of efficient cooling liquid. The cooling liquid 106 may be liquids such as propylene glycol, ethylene glycol, dielectric liquids that do not conduct electricity, and the like.

In one example, the pump 108 may be coupled to the reservoir 106 and the memory cooler 102. The cooling liquid 106 may be moved by the pump 108 through the memory cooler 102. Cooling liquid 106 may enter the memory cooler 102 at a relatively low temperature and exit the memory cooler 102 at a higher temperature.

The cooling liquid 106 may pass through a heat exchanger 110 that is coupled to the memory cooler 102. The heat exchanger 110 may re-cool the cooling liquid 106 to a desired low temperature. The cooling liquid 106 may then be returned to the reservoir 104 coupled to the heat exchanger 110 to be recycled.

In other words, the memory cooler 102, the reservoir 104, the pump 108, and the heat exchanger 110 may be deployed as a closed system. In one example, the system 100 may be deployed within a computing device, such as a desktop computer, a server, a laptop computer, and the like.

In one example, the memory cooler 102 may be a spring loaded clamping memory cooler. The memory cooler 102 may have two laterally movable cold plates $116_1$ and $116_2$ that are vertically stacked on top of one another. Thus, the cold plate $116_2$ may be hidden by the cold plate $116_1$ in FIG. 1.

The cold plates $116_1$ and $116_2$ may be coupled to respective inlet manifolds $118_1$ and $118_2$ and respective outlet manifolds $120_1$ and $120_2$. The cold plates $116_1$ and $116_2$ may receive the cooling liquid 106 through the inlet manifolds $118_1$ and $118_2$, respectively. The cold plates $116_1$ and $116_2$ may include channels that allow the cooling liquid 106 to flow through the cold plates $116_1$ and $116_2$ to the outlet manifolds $120_1$ and $120_2$.

In an example, the cold plates $116_1$ and $116_2$ may form slots $114_1$ to $114_n$ (hereinafter also referred to individually as a slot 114 or collectively as slots 114). In one example, the number of slots 114 may be equal to the number of memory modules 112.

In one example, the slots 114 may receive a memory module 112. The pairs of adjacent plates of the cold plates $116_1$ and $116_2$ may form the slots 114. In other words, each pair of adjacent plates that forms the slot 114 may include a cold plate from the cold plates $116_1$ and a cold plate from the cold plates $116_2$.

When the memory cooler 102 is in a closed position, the slots 114 formed by the cold plates $116_1$ and $116_2$ may contact the respective memory modules 112 in the slots 114. The cooling liquid 106 that passes through the cold plates $116_1$ and $116_2$ may cool the memory modules 112.

Figure 3:
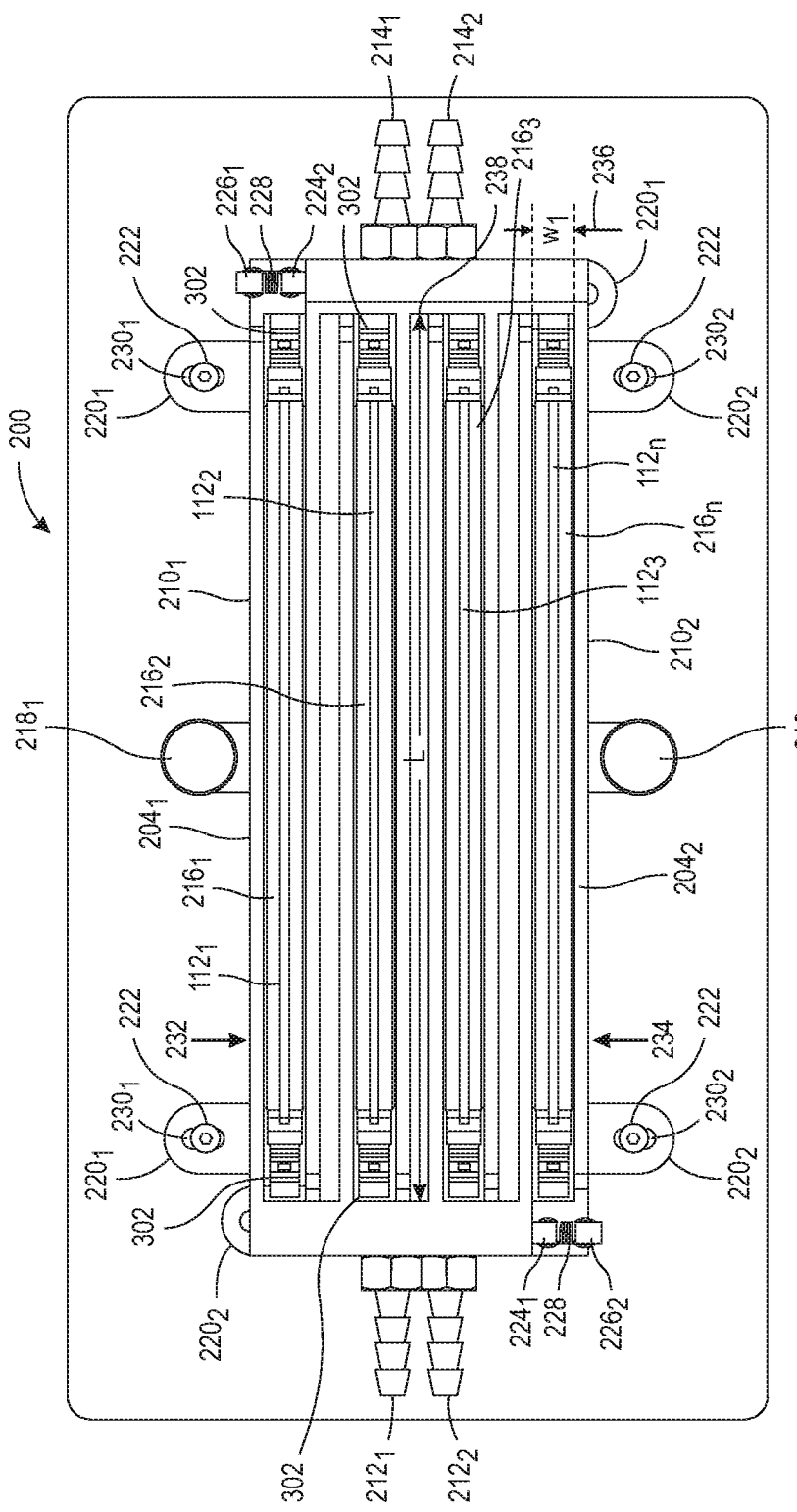
FIG. 3 is a top view of the memory cooler in a closed position.
Figure 4:
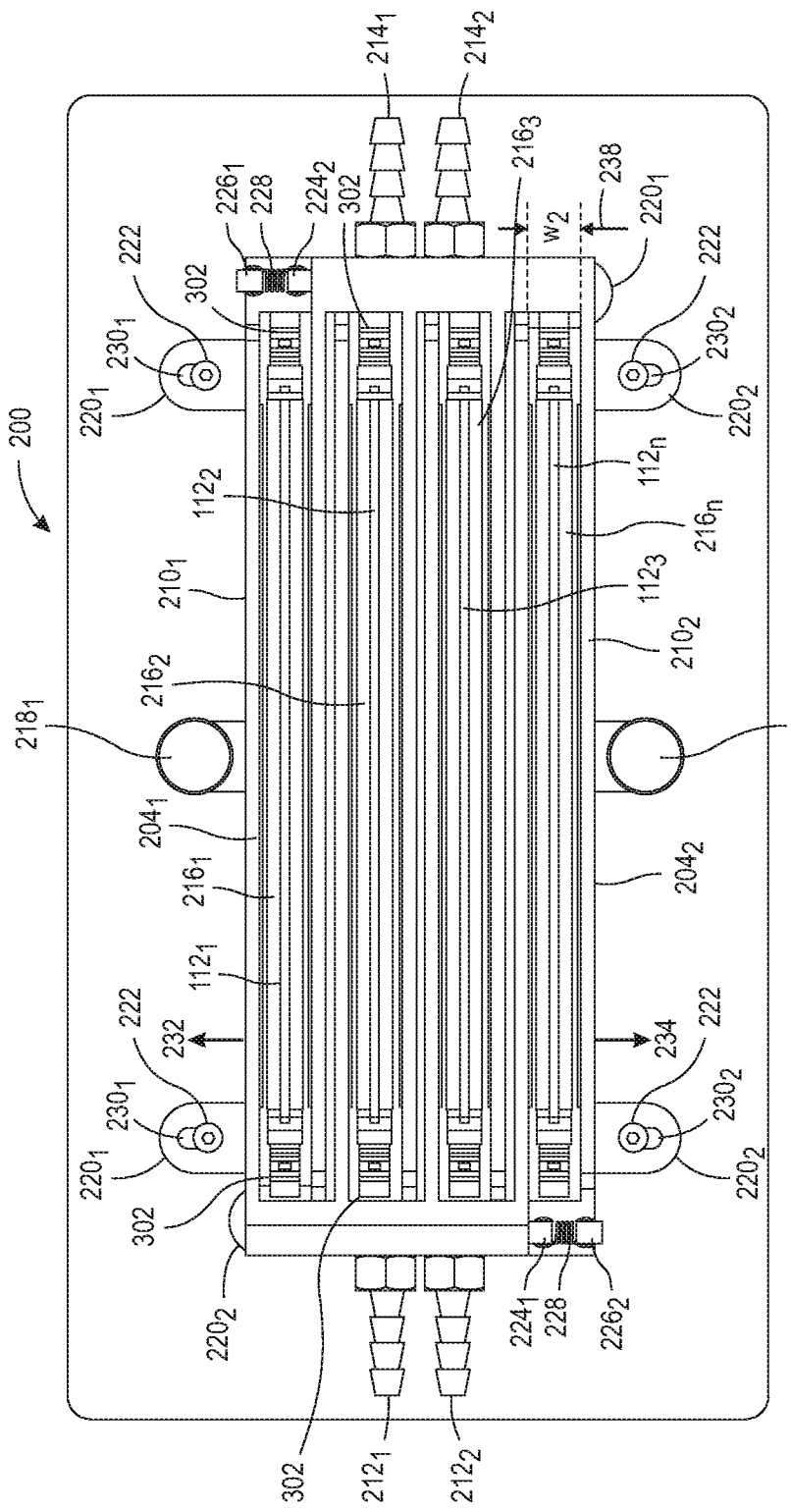
FIG. 4 is a top view of the memory cooler in an open position.

In one example, when the memory cooler 102 is in a service position or opened, the cold plates $116_1$ and $116_2$ may be pulled apart in a horizontal direction away from the memory modules 112. As a result, the memory modules 112 may be removed, replaced, repaired, and the like. Further illustrations and details of the closed position and the service position are illustrated in FIGS. 3 and 4, and discussed below.

Figure 2:
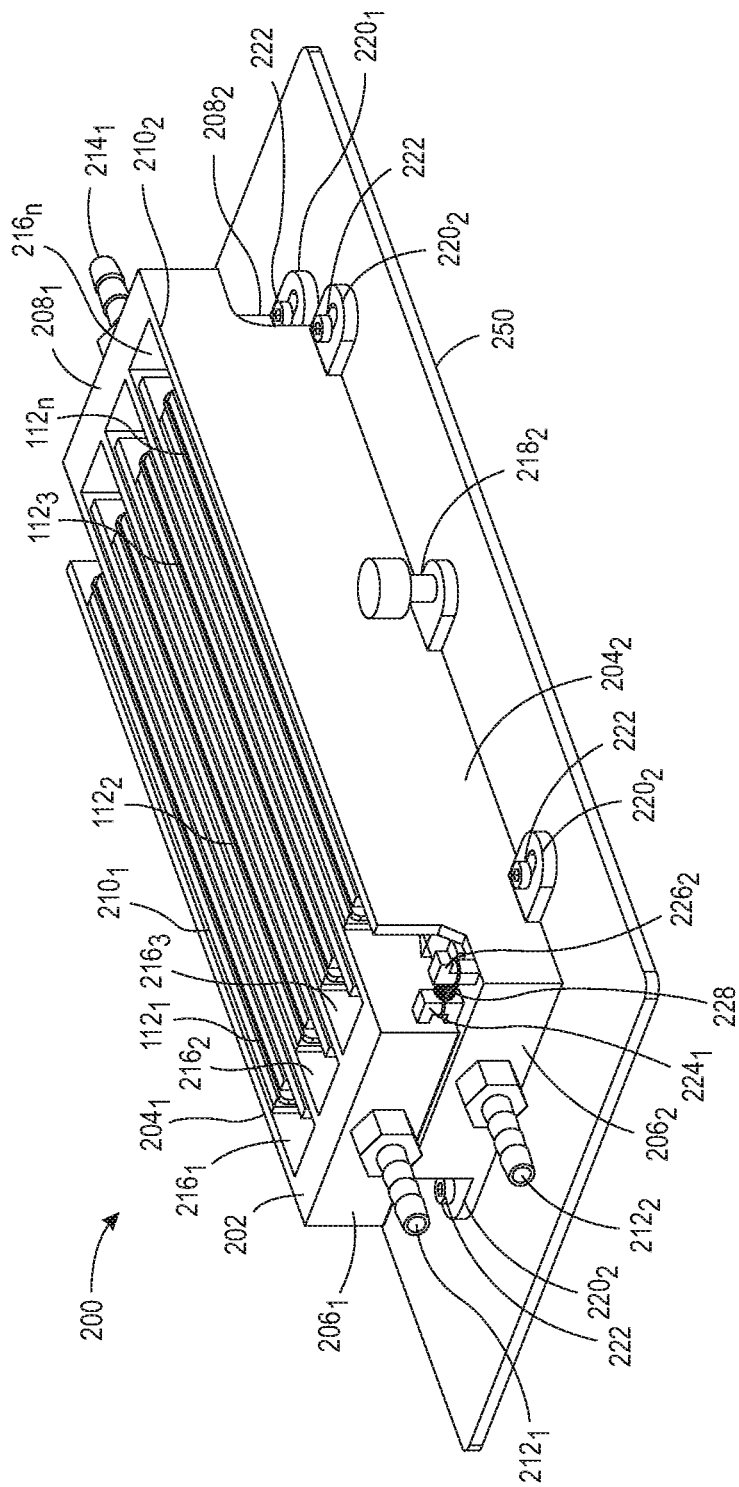
FIG. 2 is an isometric view of a memory cooler of the present disclosure.

FIG. 2 illustrates an isometric view of one example of a memory cooler 200. The memory cooler 200 may be used as the memory cooler 102 illustrated in FIG. 1. In one example, the memory cooler 200 may include a body 202. The body 202 may be formed by two pieces $204_1$ and $204_2$. One of the pieces (e.g., the piece $204_1$) may be rotated 180 degrees and vertically stacked on top of the other piece (e.g., the piece $204_2$).

In one example, the two pieces $204_1$ and $204_2$ may be identical. In other words, the two pieces $204_1$ and $204_2$ may include the same parts, same features, have the same dimensions and the like. As a result, only a single part may be kept in inventory to build the body 202. By using a single part overall inventory costs and manufacturing costs can be reduced.

In one example, the piece $204_1$ may include an inlet manifold $206_1$ and an outlet manifold $208_1$. The inlet manifold $206_1$ may have an inlet $212_1$ and the outlet manifold $208_1$ may have an outlet $214_1$. In one example, the cooling liquid 106 may enter the inlet manifold $206_1$ via the inlet $212_1$. The inlet manifold $206_1$ may then distribute a stream of the cooling liquid into many different streams that flow through a plurality of cold plates $210_1$.

The cold plates $210_1$ may include spaced walls that are coupled between the inlet manifold $206_1$ and the outlet manifold $208_1$. The cold plates $210_1$ may include channels inside of the walls. The cooling liquid 106 may flow through the channels of the cold plates $210_1$ to the outlet manifold $208_1$. The outlet manifold $208_1$ may combine the many different streams of the cooling fluid 106 into a single stream that exits the outlet $214_1$.

As noted above, the pieces $204_1$ and $204_2$ may be identical. As a result, the piece $204_2$ may also include an inlet manifold $206_2$, an outlet manifold $208_2$, an inlet $212_2$ coupled to the inlet manifold $206_2$, and an outlet $214_2$ (not seen in FIG. 2) coupled to the outlet manifold $208_2$. The piece $204_2$ may also include a plurality of cold plates $210_2$. The cold plates $210_2$ may also include spaced walls that are coupled between the inlet manifold $206_2$ and the outlet manifold $208_2$. The cold plates $210_2$ may also include channels that allow the cooling liquid 106 to flow through the cold plates $210_2$.

In one example, the cold plates $210_1$ may form slots $216_1$ to $216_n$ (hereinafter also referred to individually as a slot 216 or collectively as slots 216) with cold plates $210_2$ of the second piece $204_2$. As noted above, the first piece $204_1$ and the second piece $204_2$ may be vertically stacked on top of one another. The first piece $204_1$ and the second piece $204_2$ may be stacked such that the cold plates $210_1$ are interleaved with the cold plates $210_2$.

In other words, when the first piece $204_1$ and the second piece $204_2$ are vertically stacked, the cold plates $210_1$ and $210_2$ may be interleaved such that the cold plates $210_1$ and $210_2$ alternate across a width of the memory cooler 200. Adjacent pairs of the cold plates $210_1$ and $210_2$ may form the slots 216. Said another way, a first cold plate from the cold plates $210_1$ and a first cold plate from the cold plates $210_2$ may form the first slot $216_1$. A second cold plate from the cold plates $210_1$ and a second cold plate form the cold plates $210_2$ may form the second slot $216_2$, and so forth.

As discussed above, the cold plates $210_1$ and $210_2$ may be moved into a closed position. When the cold plates $210_1$ and $210_2$ are in the closed position, the cold plates $210_1$ and $210_2$ may contact the memory modules 112 in the respective slots 216. The cooling liquid 106 may cool the memory modules 112 as the cooling liquid 106 flows through the cold plates $210_1$ and $210_2$.

In one example, the memory cooler 200 may be coupled to a system board 250. The system board 250 may be a printed circuit board that is part of a computer system or computing device. In one example, the memory cooler 200 may be coupled to the system board 250 via sliding tabs $220_1$ of the piece $204_1$ and sliding tabs $220_2$ of the piece $204_2$. A mechanical fastener 222 may be used to movably couple (as discussed in further details below) the sliding tabs $220_1$ and $220_2$ to the system board 250.

In one example, the piece $204_1$ and the piece $204_2$ may each include a pin $218_1$ (not shown in FIG. 2) and a pin $218_2$, respectively. The pin $218_1$ and the pin $218_2$ may be used to hold the memory cooler 200 in the service position. For example, the pin $218_1$ and the pin $218_2$ may be inserted into a corresponding opening in the system board 250 when the memory cooler 200 is in the service position.

In one example, the pin $218_1$ and the pin $218_2$ may be spring loaded. Thus, the pin $218_1$ and the pin $218_2$ may automatically latch or connect to the corresponding opening in the system board 250 when the piece $204_1$ and the piece $204_2$ are pulled horizontally (e.g., along a plane of the system board 250) apart to the service position. In another example, the pin $218_1$ and the pin $218_2$ may be screwed into the corresponding openings in the system board 250 to hold the memory cooler 200 in the service position.

In one example, the piece $204_1$ may include a first spring attachment feature $224_1$ and a second spring attachment feature $226_2$ (hidden from view in FIG. 1). The first spring attachment feature $224_1$ may be located on a first side towards a first end of the piece $204_1$. The second spring attachment feature $226_1$ may be located on a second side opposite the first side and towards a second end that is opposite the first end of the piece $204_1$. In one example, the first spring attachment feature $224_1$ may be a closed tab and the second spring attachment feature $226_1$ may be a hook or an upside down "L" shaped tab. The piece $204_2$ may also include the first spring attachment feature $224_2$ (hidden from view in FIG. 1) and the second spring attachment feature $226_2$ that are similarly located on the piece $204_2$.

In one example, when the first piece $204_1$ is vertically stacked on the second piece $204_2$, the first spring attachment feature $224_1$ may be aligned with the second spring attachment feature $226_2$. In addition, the second spring attachment feature $226_1$ may be aligned with the first spring attachment feature $224_2$, which is hidden from view in FIG. 2. A spring 228 may be used to connect the first spring attachment feature $224_1$ with the second spring attachment feature $226_2$, as shown in FIG. 2. Another spring 228 may be used to connect the second spring attachment feature $226_1$ to the first spring attachment feature $224_2$, which is hidden from view in FIG. 2.

In one example, the spring 228 may provide the force to pull the cold plates $210_1$ of the piece $204_1$ and the cold plates $210_2$ of the piece $204_2$ towards each other. For example, the spring 228 may cause the memory cooler 200 to automatically go into a closed position when the pin $218_1$ and the pin $218_2$ are released from the corresponding opening in the system board 250.

FIGS. 3 and 4 illustrate top views of the memory cooler 200. FIG. 3 illustrates a top view of the memory cooler 200 in a closed position. FIG. 4 illustrates a top view of the memory cooler 200 in a service position. FIG. 3 illustrates the outlet $214_2$ of the second piece $204_2$, the pin $218_1$, the second spring attachment feature $226_1$ of the first piece $204_1$, and the first spring attachment feature $224_2$ of the second piece $204_2$ that were hidden from view in FIG. 2.

FIG. 3 also illustrates a horizontal opening $230_1$ in each of the sliding tabs $220_1$ and a horizontal opening $230_2$ in each of the sliding tabs $220_2$. The fastener 222 may be fitted through the horizontal openings $230_1$ and $230_2$. The first piece $204_1$ and the second piece $204_2$ may move horizontally (e.g., along the plane of the system board 250) to move into the closed position and the service position. In one example, the horizontal openings $230_1$ and $230_2$ may guide the horizontal movement of the first piece $204_1$ and the second piece $204_2$.

In one example, when the memory cooler 200 is in the closed position, the cold plates $210_1$ and the cold plates $210_2$ may move towards each other as shown by the direction of arrows 232 and 234. As noted above, the springs 228 may pull the cold plates $210_1$ towards the cold plates $210_2$. The cold plates $210_1$ may be pulled towards the cold plates $210_2$ until the adjacent pairs of the cold plates $210_1$ ad $210_2$ contact a respective memory module 112.

As noted above, the adjacent pairs of the cold plates $210_1$ and $210_2$ may form the slots 216. In one example, the slots 216 may have dimensions that are a function of the size of the memory module 112 and a clamping mechanism 302 of the memory module 112. In one example, the length "l" may be measured as shown by a line 238 in FIG. 3. In the closed position, each slot 216 may have a first width "$w_1$" as shown by lines 236.

FIG. 4 illustrates a top view of the memory cooler 200 in the service position. In one example, the cold plates $210_1$ and the cold plates $210_2$ may be pulled apart in a horizontal direction as shown by the direction of the arrows 232 and 234. The movement of the first piece $204_1$ and the second piece $204_1$ may be guided by the horizontal openings $230_1$ and $230_2$ in the sliding tabs $220_1$ and $220_2$, respectively.

In one example, when the cold plates $210_1$ and the cold plates $210_2$ are pulled apart in opposite horizontal directions, the width of the slots may increase. For example, FIG. 4 illustrates the slots 216 have a second width "$w_2$". The second width may be greater than the first width (e.g., $w_2 > w_1$) when the memory cooler is in the service position. As a result, the memory module 112 may be removed from a respective slot 116, replaced with another memory module 112, repaired, and the like.

In one example, when the memory cooler 200 is in the service position, the pin $218_1$ and the pin $218_2$ may be fitted into a corresponding opening in the system board 250. As the cold plates $210_1$ and the cold plates $210_2$ are pulled apart, the pin $218_1$ may catch a corresponding opening. The pin $218_2$ may also catch a corresponding opening. Thus, when the pin $218_1$ and the pin $218_2$ are moved into the corresponding openings, the pin $218_1$ and the pin $218_2$ may lock the memory cooler 200 in the service position.

In one example, to return the memory cooler 200 into the closed position, the pin $218_1$ and the pin $218_2$ may be removed from the corresponding openings. For example, the pins $218_1$ and the pin $218_2$ may be pulled up (e.g., out of the page) to be released.

Figure 5:
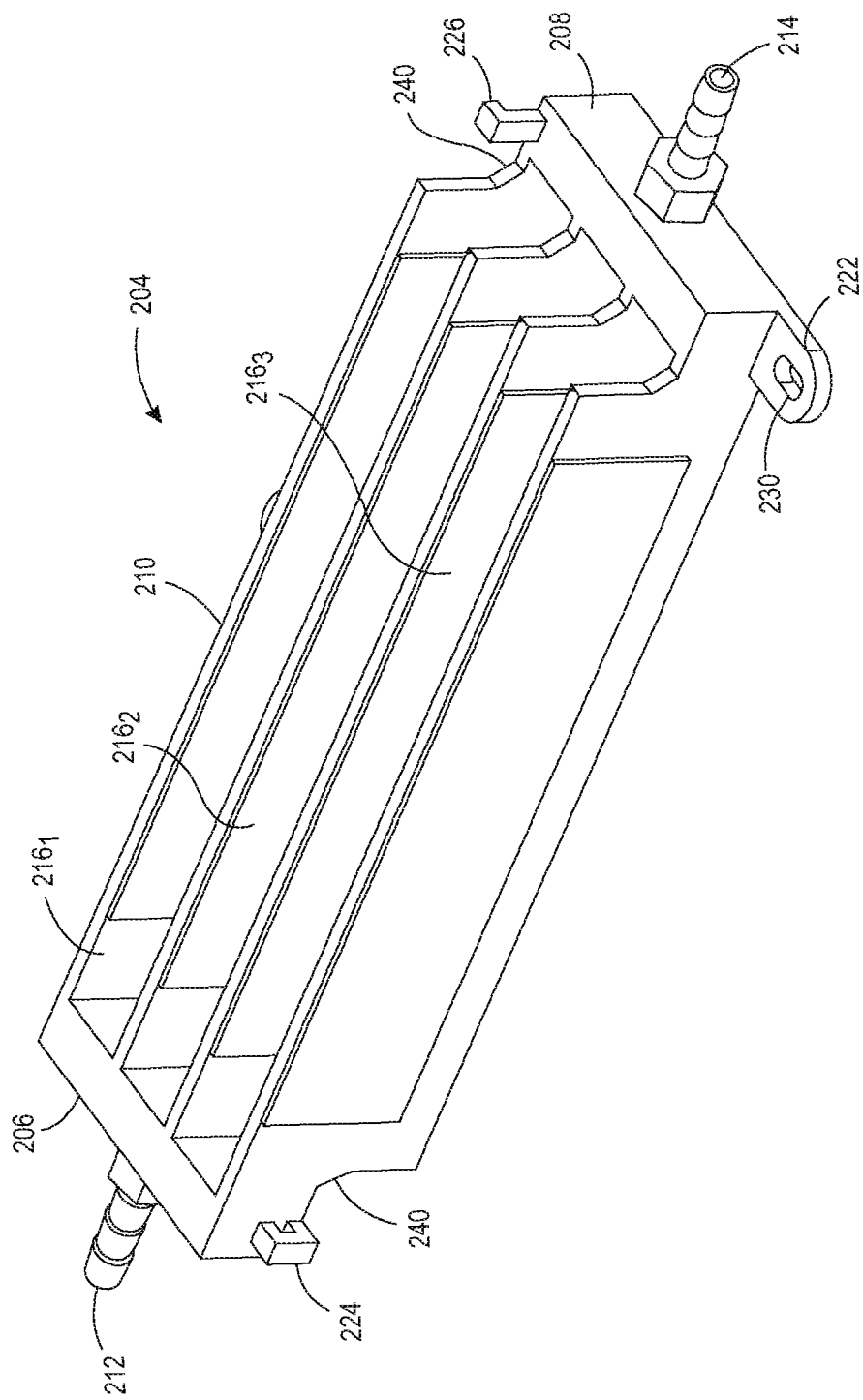
FIG. 5 is a top isometric view of a single piece of the body of the memory cooler of the present disclosure.

FIG. 5 illustrates an isometric top view of a single piece 204. As noted above, the piece $204_1$ and $204_2$ may be identical. Thus, the piece 204 illustrated in FIG. 5 may be used as both the piece $204_1$ and $204_2$ illustrated in FIGS. 2-4 above. Notably, the piece 204 only shows three slots $216_1$-$216_3$. If four slots 216 are used as shown in the FIGS. 2-4 above, the cold plates $210_2$ of the second piece $204_2$ may form the fourth slot $216_4$ with the cold plates $210_1$ of the first piece $204_1$.

Although FIG. 5 illustrates four cold plates 210, to form four slots 216 when interleaved with another cold plate 210 of another piece 204, it should be noted that the piece 204 may include any number of cold plates to form any number slots for a particular system board 250. For example, if the system board 250 used eight memory modules 112, then the piece 204 may include eight cold plates 210 to be interleaved with eight cold plates 210 of another piece 204 to form eight slots that can each receive a memory module 112.

In one example, the piece 204 may include a cut out 240 on each end. The cut out 240 may allow the inlet manifold 206 and the outlet manifold 208 of a second piece 204 to lay flat on the inlet manifold 206 and the outlet manifold 208 of the first piece when vertically stacked.

Figure 6:
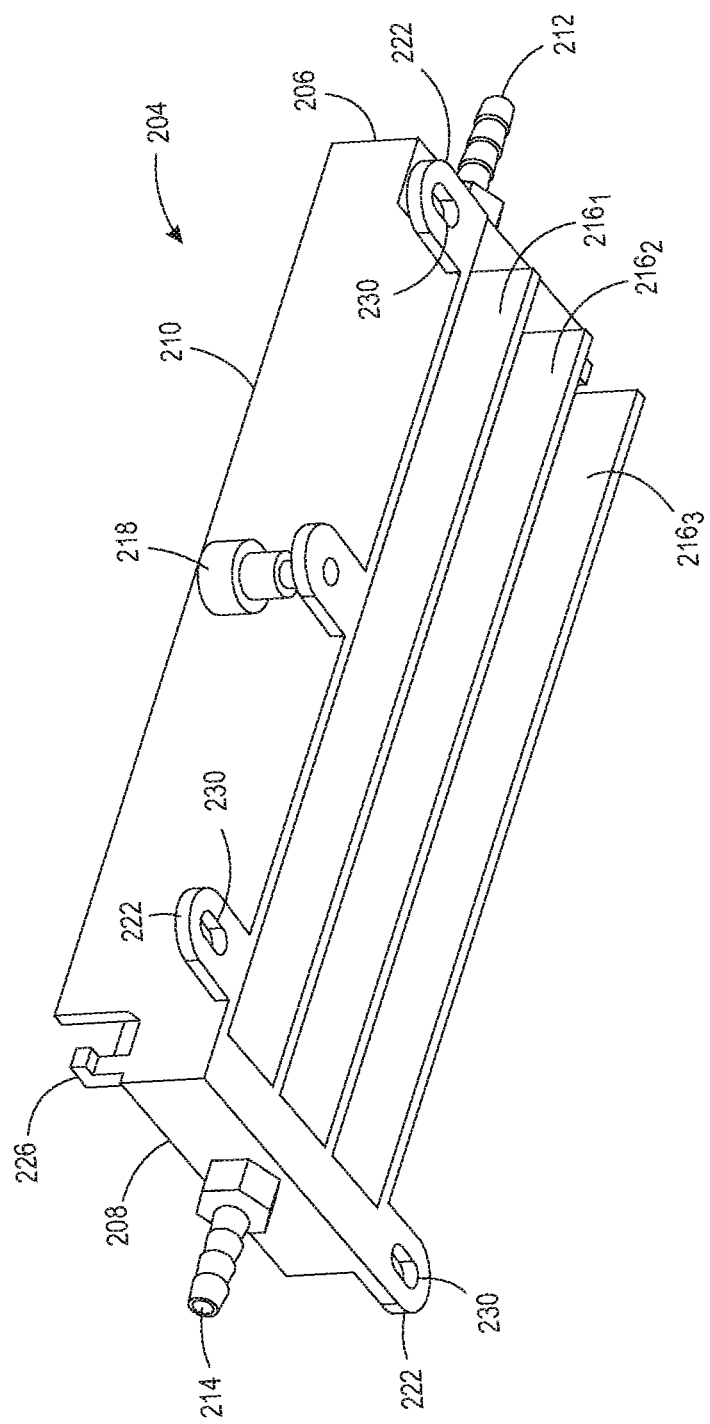
FIG. 6 is a bottom isometric view of the single piece of the body of the memory cooler of the present disclosure.

FIG. 6 illustrates an isometric bottom view of a single piece 204. FIG. 6 illustrates how the pin 218 may be pushed down to extend a portion of the pin 218 through an opening in a connecting tab. Similarly, when the pin 218 is pulled up, the bottom of the pin 218 may sit in the opening flush with a bottom of the connecting tab.

Figure 7:
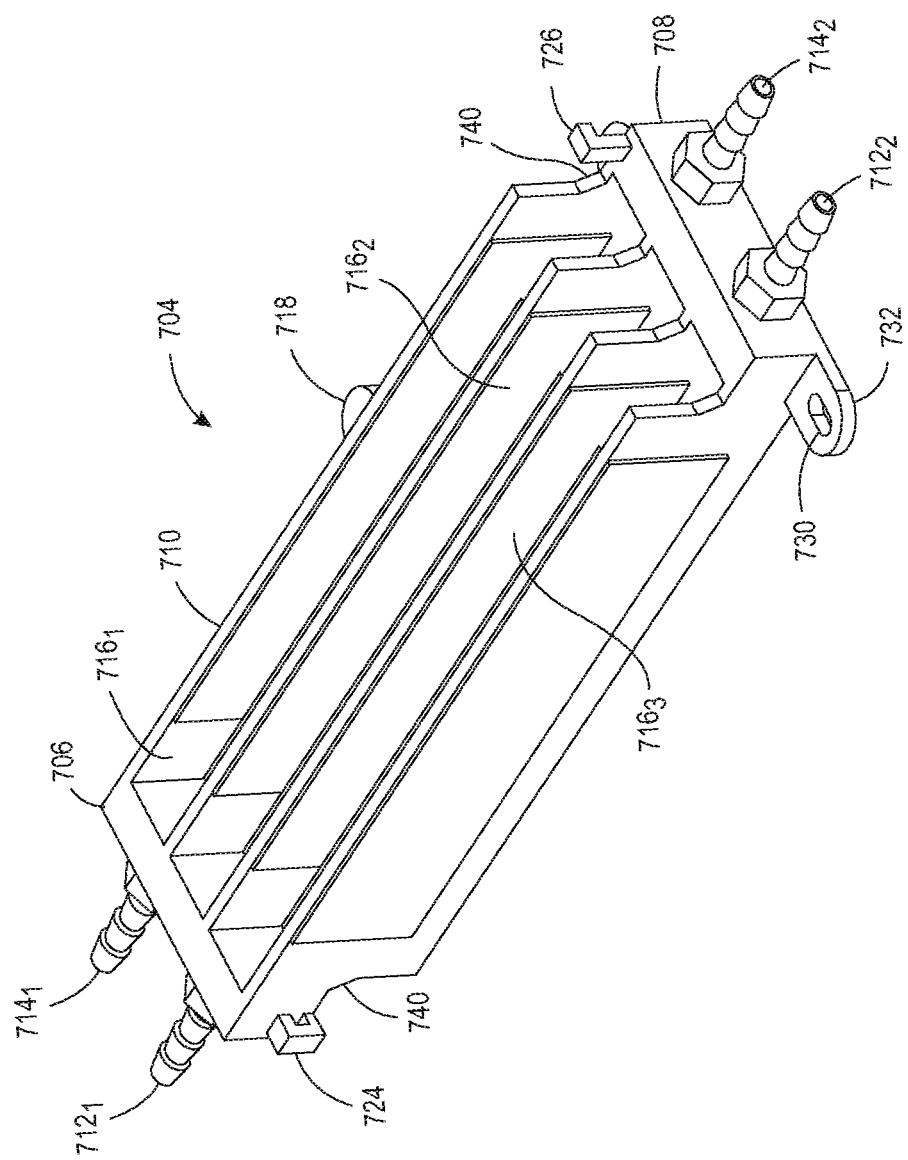
FIG. 7 is a top isometric view of a single piece of the body of the memory cooler having an inlet and an outlet on each end of the present disclosure.

FIG. 7 illustrates an isometric view of another example of a single piece 704 of the memory cooler 200. In one example, the single piece 704 may include cold plates 710 that are solid. In other words, the cold plates 710 may not include channels or openings in which the cooling liquid 106 may flow through the cold plates 710.

As a result, the piece 704 may include a first end 706 that includes a first inlet $712_1$ and a first outlet $714_1$. The piece 704 may also include a second end 708 that includes a second inlet $712_2$ and a second outlet $714_2$. The cooling liquid 106 may be fed to the first inlet $712_1$. The cooling liquid 106 may flow through the first end 706 and exit the first outlet $714_1$. Similarly, the cooling liquid 106 may also be fed to the second inlet $712_2$. The cooling liquid 106 may flow through the second end 708 and exit the second outlet $714_2$. In other words, the cooling liquid 106 may flow through the first end 706 and the second end 708, but not through the cold plates 710.

However, the piece 704 may be similar to the piece 204 in all other respects. For example, two pieces 704 may be movably coupled together to form the body of a memory cooler. For example, one piece 704 may be rotated 180 degrees and vertically stacked on another piece 704.

The cold plates 710 may also form slots 716 with the cold plates 710 of another piece 704, when they are vertically stacked and interleaved with one another. The slots 716 may receive a memory module 112.

The piece 704 may include a pin 718 to lock the memory cooler into a service position. The piece 704 may include a sliding tab 732 with a horizontal opening 730. A fastener may be inserted through the horizontal opening 730 to couple the memory cooler to the system board 250. The horizontal opening 730 in the sliding tab 732 may guide the horizontal movement of the pieces 704 when stacked on top of one another.

The piece 704 may include a first spring attachment feature 724 and a second spring attachment feature 726. When two pieces 704 are vertically stacked and interleaved with one another, a spring may be used to connect the first spring attachment feature 724 of a first piece 704 to a second spring attachment feature 726 of a second piece 704 and to connect the first spring attachment feature 724 of the second piece 704 to the second spring attachment feature 726 of the first piece 704.

Thus, the piece 704 may be similar in many respects to the piece 204. However, as noted above, the piece 704 may have cold plates 710 that are solid and are channel free to prevent the cooling liquid 106 from flowing through the cold plates 710. As a result, the first end 706 and the second end 708 may have separate sets of inlets and outlets (e.g., inlet $712_1$ and outlet $714_1$ and inlet $712_2$ and outlet $714_2$).

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

The invention claimed is:

1. A memory cooler, comprising:
a body comprising two pieces that are moveable relative to one another, wherein each piece of the body comprises:
an inlet manifold to receive liquid coolant from a liquid coolant supply line;
an outlet manifold to return the liquid coolant to the liquid coolant supply line; and
a plurality of cold plates extending between the inlet manifold and the outlet manifold such that the liquid coolant is to flow from the inlet manifold to the outlet manifold through interior channels of the cold plates, wherein the plurality of cold plates of a first piece of the body are interleaved with the plurality of cold plates of a second piece of the body such that slots to receive memory modules are defined between adjacent pairs of cold plates.

2. The memory cooler of claim 1, each piece of the body further comprising:
a sliding tab coupled to each piece of the body, wherein the sliding tab is to attach each piece of the body to a system board.

3. The memory cooler of claim 2, wherein the two pieces of the body move in opposite directions along a horizontal plane into a service position, wherein movement of the two pieces of the body are guided by the sliding tab.

4. The memory cooler of claim 3, each piece of the body further comprising:
a pin coupled to each piece of the body, wherein the two pieces of the body are held in the service position via the pin mating with a corresponding opening in the system board.

5. The memory cooler of claim 4, wherein the pin is spring loaded.

6. The memory cooler of claim 3, each piece of the body further comprising a first tab on a first side and a second tab one a second side.

7. The memory cooler of claim 6, wherein the first tab on the first side of the first piece of the body is coupled, via a first spring, to a second tab on the second side of the second piece of the body and the second tab on the second side of the first piece of the body is coupled, via a second spring, to the first tab on the first side of the second piece of the body.

8. The memory cooler of claim 7, wherein the first spring and the second spring pull the two pieces together into a locked position.

9. A memory cooler, comprising:
a body comprising two pieces that are movable relative to one another, wherein each piece of the body, comprises:
a first end comprising a first inlet to receive liquid coolant from a liquid coolant supply line and a first outlet to return the liquid coolant to the liquid coolant supply line;
a second end opposite the first end comprising a second inlet to receive the liquid coolant and a second outlet to return the liquid coolant to the liquid coolant supply line;
a plurality of cold plates extending between the first manifold an the second manifold, wherein the liquid coolant cools the plurality of cold plates on the first end and the second end, wherein the plurality of cold plates of the first piece of the body are interleaved with the plurality of cold plates of a second piece of the body such that slots to receive memory modules are defined between adjacent pairs of cold plates.

10. The memory cooler of claim 9, each piece of the body further comprising:
a tab coupled to each piece of the body, wherein the tab comprises a horizontal opening to attach each piece of the body to a system board via a mechanical fastener.

11. The memory cooler of claim 10, wherein the two pieces of the body move in opposite directions along the horizontal opening of the tab into a service position.

12. The memory cooler of claim 11, each piece of the body further comprising:
a pin coupled to each piece of the body, wherein the two pieces of the body are held in the service position via the pin mating with a corresponding opening in the system board.

13. The memory cooler of claim 10, each piece of the body further comprising a spring attachment feature on a first side and a second spring attachment feature on a second side.

14. The memory cooler of claim 13, wherein the first spring attachment feature on the first side of the first piece of the body is coupled, via a first spring, to a second spring attachment feature on the second side of the second piece of the body and the second spring attachment feature on the second side of the first piece of the body is coupled, via a second spring, to the first spring attachment feature on the first side of the second piece of the body.

15. The memory cooler of claim 14, wherein the first spring and the second spring pull the two pieces together into a locked position.

16. The memory cooler of claim 9, wherein an area of the each one of the slots is a function of size of the respective memory device and a clamping mechanism of the respective memory device.

17. The memory cooler of claim 9, wherein each piece of the body is identical.

18. A memory cooling system, comprising:
a reservoir containing a cooling liquid;
a pump to move the cooling liquid;
a spring loaded clamping memory cooler coupled to the pump, wherein the spring loaded clamping memory cooler encloses a plurality of memory devices via slots formed by two laterally movable cold plates, wherein the pump moves the cooling liquid through the two laterally movable cold plates of the spring loaded clamping memory cooler to cool the plurality of memory devices, wherein the spring loaded clamping memory cooler comprises a body, comprising two pieces, wherein a first one of the laterally movable cold plates is coupled to a first piece and a second one of the laterally movable cold plates is coupled to a second piece, wherein each piece of the body comprises:
an inlet manifold to receive the cooling liquid;
an outlet manifold to return the cooling liquid to the reservoir
a sliding tabs that is to attach the piece of the body to a system board such that the body is capable of sliding relative to the system board;
a first spring attachment feature coupled to the first side on a first end of the piece;
a second spring attachment feature coupled to the second side on a second end of the piece; and
a spring loaded pin coupled the piece; and a heat exchanger coupled to the spring loaded clamping memory cooler and the reservoir to re-cool the cooling liquid and return the cooling fluid to the reservoir.

19. The memory cooling system of claim 18, wherein the two pieces of the body are vertically stacked and coupled to one another via springs coupled to the first spring attachment feature and the second spring attachment feature of each of the two pieces of the body.

* * * * *